(12) United States Patent
Kim et al.

(10) Patent No.: US 6,980,345 B2
(45) Date of Patent: Dec. 27, 2005

(54) HIGH SPEED OPTICAL SIGNAL PROCESSOR INCLUDING SATURABLE ABSORBER AND GAIN-CLAMPED OPTICAL AMPLIFIER

(75) Inventors: Hyun-Soo Kim, Daejeon (KR); Jong-Hoi Kim, Daejeon (KR); Eun-Deok Sim, Daejeon (KR); Kang-Ho Kim, Daejeon (KR); Oh-Kee Kwon, Anyang (KR); Kwang-Ryong Oh, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/672,220

(22) Filed: Sep. 26, 2003

(65) Prior Publication Data

US 2004/0109221 A1    Jun. 10, 2004

(30) Foreign Application Priority Data

Dec. 10, 2002  (KR) ...................... 10-2002-0078257

(51) Int. Cl.[7] .............................. G02F 1/03; G02F 1/07
(52) U.S. Cl. .................. 359/248; 359/339; 359/337.21
(58) Field of Search ................... 359/245–48, 254, 359/295, 332–34, 337.1, 337.2, 345, 337.21, 359/339, 337.5, 248; 257/431–436; 385/2, 385/3, 8, 10, 13, 123–32

(56) References Cited

U.S. PATENT DOCUMENTS

| | | | | |
|---|---|---|---|---|
| 5,175,643 A | * | 12/1992 | Andrews | 359/339 |
| 5,179,615 A | * | 1/1993 | Tanaka et al. | 385/131 |
| 5,317,448 A | * | 5/1994 | Nobuhara | 359/333 |
| 5,754,714 A | * | 5/1998 | Suzuki et al. | 385/5 |
| 5,805,327 A | | 9/1998 | Usami et al. | 359/244 |
| 6,356,693 B1 | * | 3/2002 | Shimizu et al. | 385/131 |

OTHER PUBLICATIONS

IEEE Journal, vol. 7, No. 2, Mar./Apr. 2001, Fabrication of Saturable Absorbers in InGaAsP-InP Bulk Semiconductor Laser Diodes by Heavy Ion Implantation, M. Dulk, et al. Cleo '97, Tuesday, May 20, pp. 124 and 125.

* cited by examiner

Primary Examiner—Jordan M. Schwartz
Assistant Examiner—Jessica Stultz
(74) Attorney, Agent, or Firm—Blakely, Sokoloff, Taylor & Zafman

(57) ABSTRACT

Disclosed is a high speed optical signal processor which includes a saturable absorber area including a substrate, an active layer, a clad layer and a first upper electrode which are sequentially formed on one face of the substrate, and a first lower electrode formed on the other face of the substrate; and a gain-clamped optical amplifier area including a substrate having a diffraction grating for generating a laser beam, an active layer, a clad layer and a second upper electrode which are sequentially formed on one face of the substrate, and a second lower electrode formed on the other face of the substrate, the second upper electrode being isolated from the first upper electrode of the saturable absorber area.

9 Claims, 5 Drawing Sheets

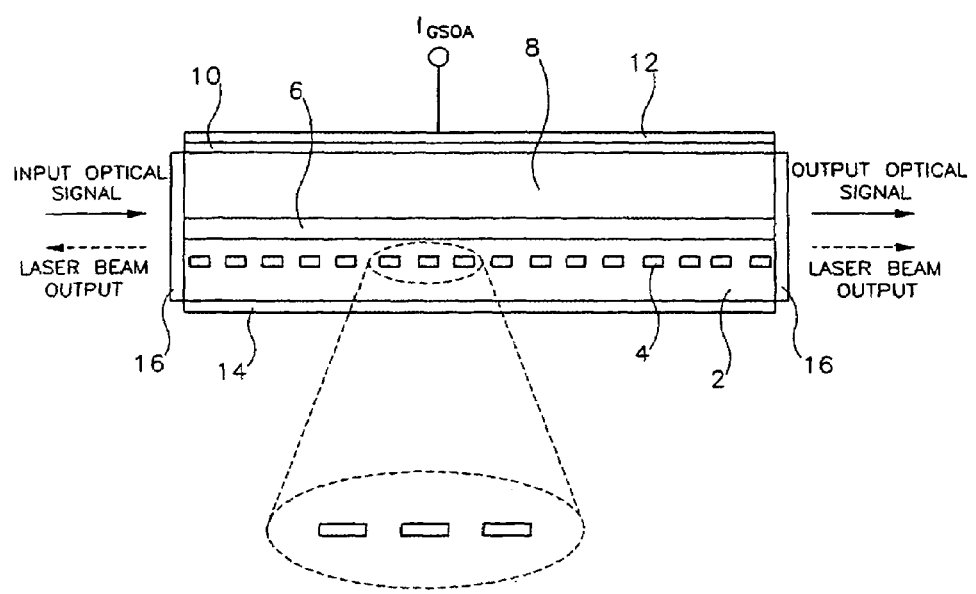
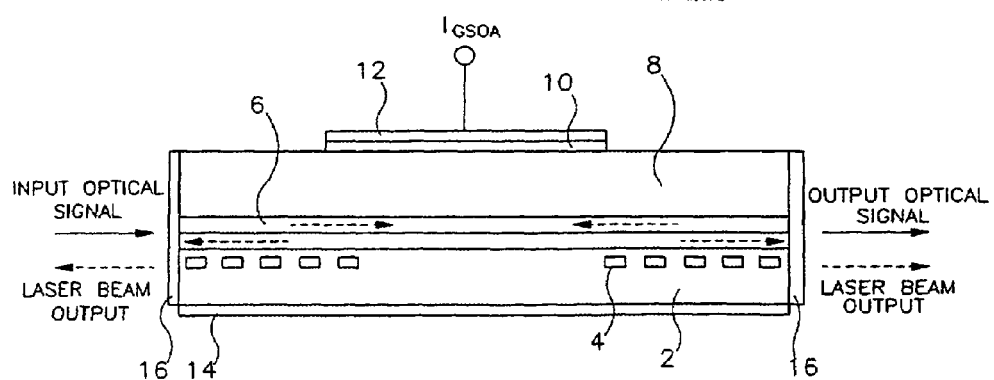

HIGH SPEED OPTICAL SIGNAL PROCESSOR INCLUDING SATURABLE ABSORBER AND GAIN-CLAMPED OPTICAL AMPLIFIER

CROSS REFERENCE TO RELATED APPLICATION

This application is based on Korea Patent Application No. 2002-78257 filed on Dec. 10, 2002 in the Korean Intellectual Property Office, the content of which is incorporated herein by reference.

BACKGROUND OF THE INVENTION (a) Field of the Invention

The present invention relates to an optical signal processor used as a core component of a wavelength division multiplexing optical transmission and switching system. More specifically, the present invention relates to a high speed optical signal processor including a saturable absorber and a gain-clamped optical amplifier, which has satisfactory characteristics even when an input optical signal is a high rate pulse or a pulse having a narrow width.

(b) Description of the Related Art

A saturable absorber has been frequently used for a pulse laser such as a mode-locking laser diode, and recently it has been applied to optical signal processing devices for noise reduction and light detection.

Luminous intensity variation and absorption coefficient characteristics obtained in the case that a conventional saturable absorber is used are shown in FIG. 3. That is, input light having power of less than a transparent input power is absorbed, but most input light with power of more than the transparent input power is transmitted with only a little loss generated. Accordingly, in the case that a signal light having noise is injected into the saturable absorber, the noise is absorbed by the saturable absorber and removed when it has intensity lower than the transparent input power.

Furthermore, the relation between time and a variation in absorption coefficient of an input signal pulse having a narrow width of several ps is shown in FIG. 4. In the graph of FIG. 4, the absorption coefficient at the rising leading edge where luminance intensity of the optical signal pulse starts to increase is dropped at a rapid response speed. However, the absorption coefficient is recovered very slowly from the dropping trailing edge at which luminance starts to decrease. This absorption coefficient variation is caused by a long lifetime of a carrier. Consequently, when light inputted into the saturable absorber includes a pulse having a width narrower than the carrier lifetime, the saturable absorber cannot fulfil its noise removal function.

A semiconductor optical amplifier conventionally used in an optical communication system creates an amplified spontaneous emission during its amplification process. At this time, a noise in the form of a pulse with a narrow width cannot be removed with the saturable absorber according to the above-described reason, so that it largely restricts a transmission distance.

Accordingly, it is possible to evade the restriction in data transmission band width and transmission distance only when the carrier lifetime is reduced such that the saturable absorber can absorb even the pulse with a narrow width to remove it. In this case, the absorption coefficient with respect to time when an input pulse having a width of several ps is injected into the saturable absorber is dropped at a fast response speed at the rising leading edge where luminance intensity of the optical signal pulse starts to increase, as shown in FIG. 5. Furthermore, the absorption coefficient is recovered symmetrically with the luminance intensity variation even at the dropping trailing edge at which the luminance intensity starts to decrease. This means that stabilized characteristics can be obtained in the case that the carrier lifetime is reduced.

Methods for reducing the carrier lifetime include a method of injecting a heavy ion into the saturable absorber to generate defects therein, as described in an article entitled "Topics in Quantum Electron", in IEEE, No. 2, Vol. 7, March 2002; a method of applying a reverse voltage to the saturable absorber to expel carriers generated due to light absorption in the saturable absorber from the absorber, as described in J. Lightwave Technol, Vol. 10, 1992; a method of growing a saturable absorption layer at a temperature lower than the conventional case to form a vacancy and defect, as described in IEE Electron, Lett Vol. 3, 1995; and a method of continuously inputting light to the saturable absorber to remove the excited carriers in the saturable absorber by stimulated emission, as disclosed in U.S. Pat. No. 5,805,327.

However, the aforementioned methods require a separate ion implanting apparatus, cause deterioration in the quality of an epitaxial layer due to low-temperature growth, or need additional apparatuses such as a light-emitting device and a voltage applying device.

SUMMARY OF THE INVENTION

It is an object of the present invention to provide a high speed optical signal processor including a saturable absorber and a gain-clamped optical amplifier to shorten the carrier lifetime without having an additional device for the purpose of raising response speed of a high speed optical transmission system using a semiconductor optical amplifier and operating the system rapidly even for a fast input pulse having a narrow width, thereby transmitting data without having distortion.

To accomplish the object of the present invention, an optical signal processor in accordance with an embodiment of the invention comprises a saturable absorber area including a substrate, an active layer, a clad layer, and a first upper electrode which are sequentially formed on one face of the substrate, and a first lower electrode formed on the other face of the substrate; and a gain-clamped optical amplifier area including a substrate having a diffraction grating for generating a laser beam, an active layer, a clad layer, and a second upper electrode which are sequentially formed on one face of the substrate, and a second lower electrode formed on the other face of the substrate, the second upper electrode being isolated from the first upper electrode of the saturable absorber area.

In the optical signal processor according to an embodiment of the invention, the saturable absorber area further includes an ohmic contact layer formed between the clad layer and the first upper electrode, and the gain-clamped optical amplifier area further includes an ohmic contact layer formed between the clad layer and the second upper electrodes.

In the optical signal processor, the saturable absorber area and the gain-clamped optical amplifier area are formed on one substrate, and the first and second upper electrodes are isolated from each other according to an etched groove.

In the optical signal processor according to the present invention, the facets of the saturable absorber area and the gain-clamped optical amplifier area are shielded by an anti-reflection thin film.

In the optical signal processor according to an embodiment of the invention, the period of the diffraction grating is varied to control the wavelength of the laser beam generated by the diffraction grating. The period of the diffraction grating is controlled such that the wavelength of the laser beam is included in a gain bandwidth of the active layer but is not included in an amplification bandwidth of the gain-clamped optical amplifier area.

In the optical signal processor, the substrate of the saturable absorber area and the gain-clamped optical amplifier area is formed of n-type InP, the active layer is formed of InGaAsP, and the clad layer is made of InP.

An optical signal processor in accordance with another embodiment of the present invention comprises a substrate including a diffraction grating for generating a laser beam; an active layer formed on one face of the substrate; a clad layer formed on the active layer; first and second upper electrodes formed on the clad layer, having a distance between them; and a lower electrode formed on the other face of the substrate, wherein the diffraction grating is formed at only one side of the substrate in the direction of the width of the substrate, and the first and second upper electrodes are respectively formed on the region having the diffraction grating and the region that does not include the diffraction grating.

A method for fabricating an optical signal processor according to another embodiment of the present invention comprises the steps of forming a substrate; forming a diffraction grating inside the substrate such that the diffraction grating is included in only one side of the substrate in the direction of the width of the substrate; sequentially forming an active layer, a clad layer, and an upper electrode on one face of the substrate; forming a lower electrode on the other face of the substrate; and forming a groove in the upper electrode to divide the upper electrode into two parts that are isolated from each other, one of the two parts being located on the portion of the substrate including the diffraction grating, the other one of the two parts being placed on the region of the substrate that does not include the diffraction grating.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIGS. 2A and 2B are longitudinal views showing the structure of a conventional semiconductor gain-clamped optical amplifier;

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
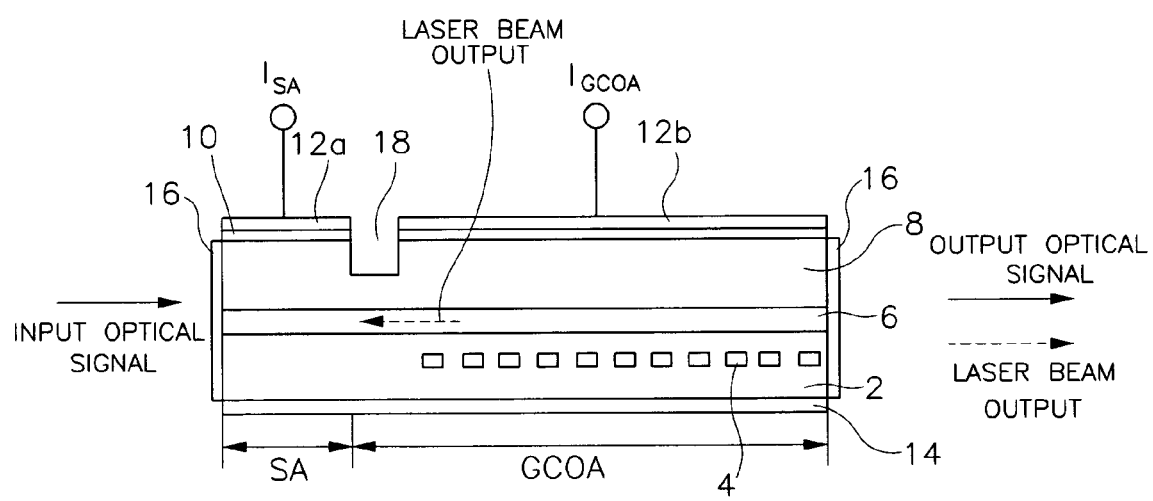
FIG. 1 is a longitudinal view showing the structure of a high speed optical signal processor according to the present invention.
Figure 3:
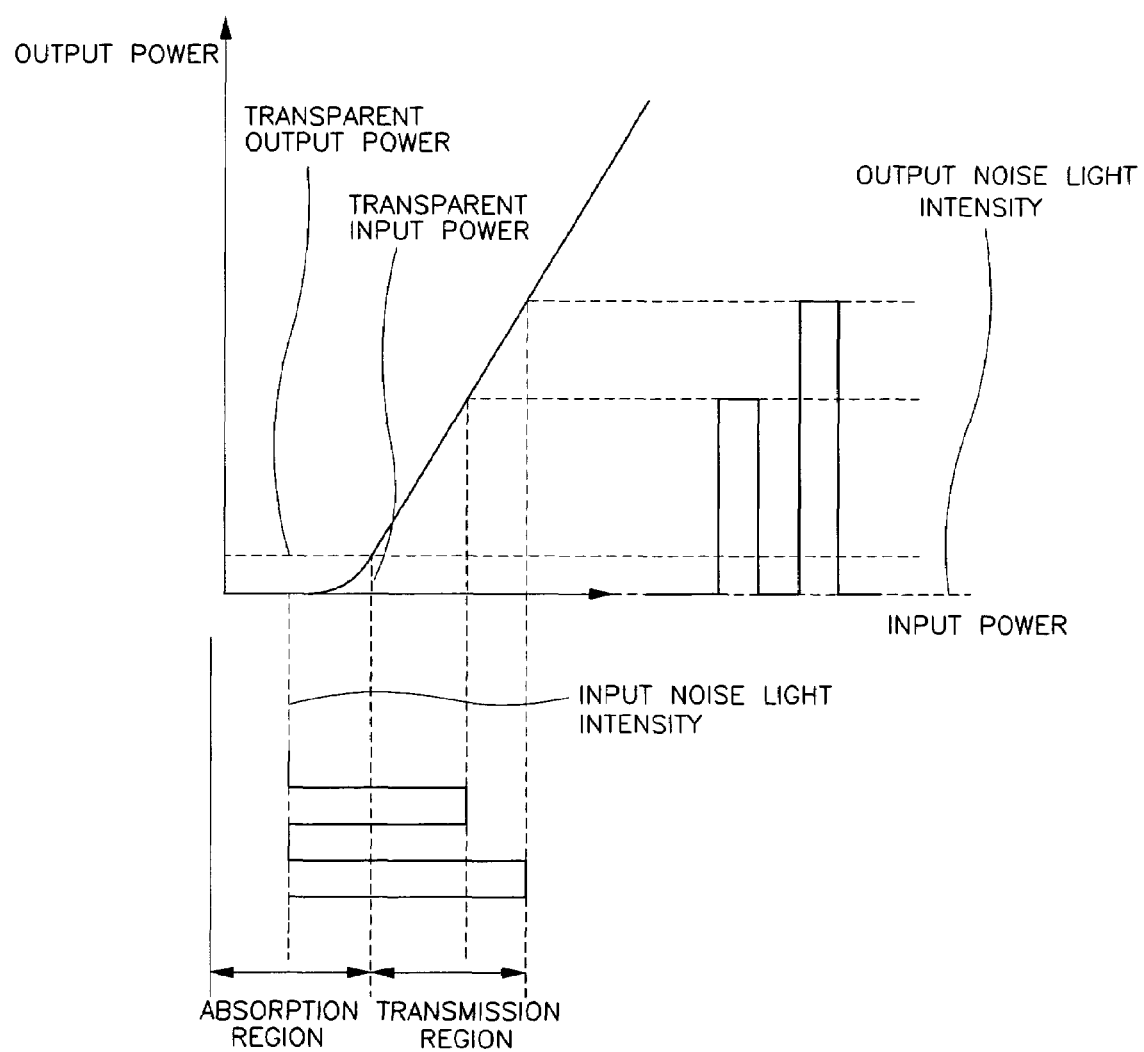
FIG. 3 is a graph for explaining a process of removing noise according to a conventional saturable absorber.
Figure 4:
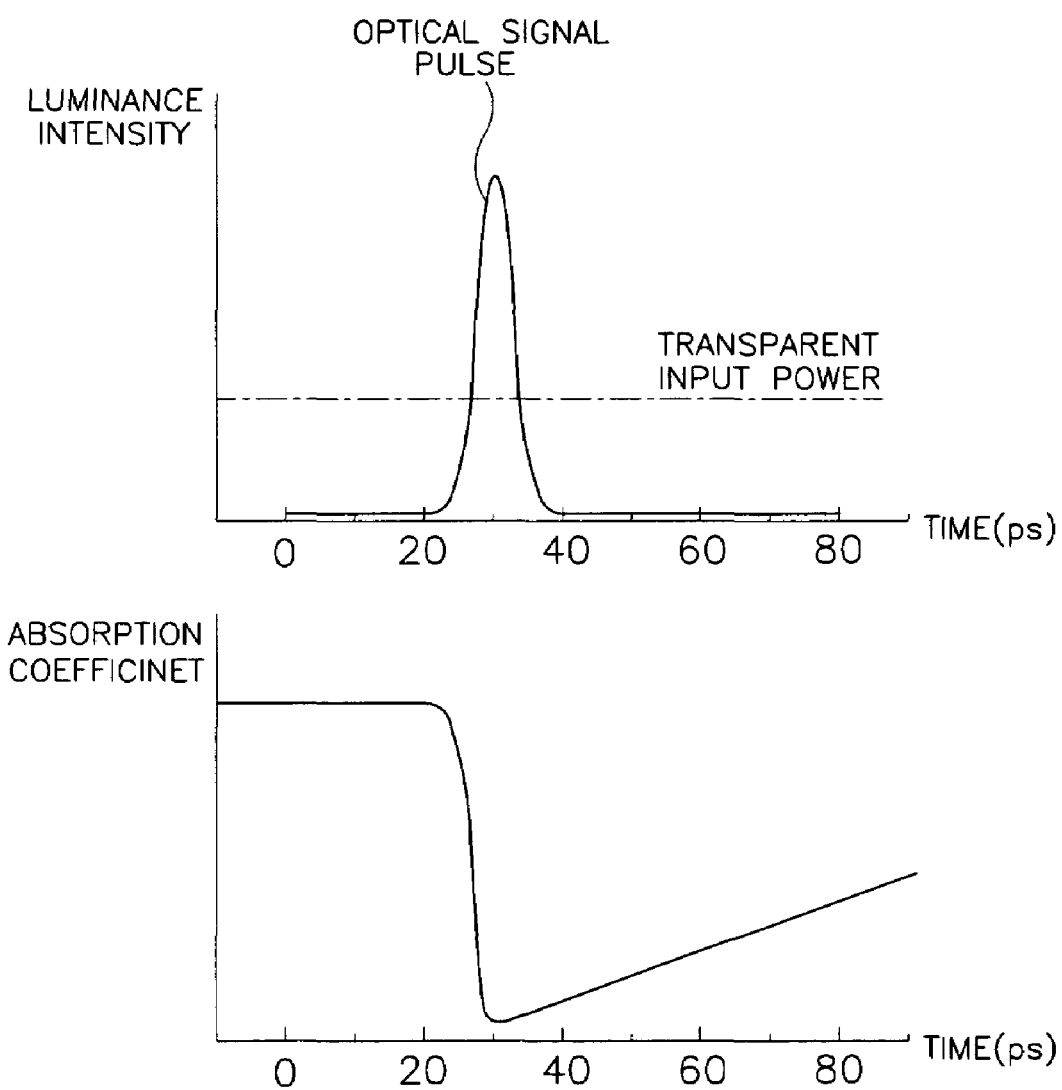
FIG. 4 is a graph showing a variation in absorption coefficient of an optical signal pulse with respect to time according to the conventional saturable absorber.

FIG. 1 is a longitudinal view roughly showing the structure of a high-speed optical signal processor according to an embodiment of the present invention. As shown in FIG. 1, the optical signal processor according to the present invention includes an n-type InP substrate 2, and a diffraction grating 4 formed in a predetermined region of the n-type InP substrate 2 in the direction of the width of the substrate. The optical signal processor further includes an undoped InGaAsP active layer 6, a p-type InP clad layer 8, an InGaAs ohmic contact layer 10, upper metal electrodes 12a and 12b that are sequentially formed on the n-type InP substrate 2, and a lower metal electrode 14 formed on the bottom face of the n-type InP substrate 2.

According to an embodiment of the present invention, the upper metal electrodes 12a and 12b are isolated from each other by a groove 18 formed through a lithography process. One of the upper metal electrodes 12a is formed on the region that does not include the diffraction grating 4, and the other one 12b is formed on the region having the diffraction grating 4. By doing so, the upper metal electrode 12a serves as a terminal of a saturable absorber area SA and the upper metal electrode 12b functions as a terminal of a gain-clamped optical amplifier area GCOA.

The optical signal processor according to the embodiment of the present invention has a multilevel structure as shown in FIG. 1. This multilevel structure is formed through well-known processes including deposition, etching, doping, diffusion, and so on. The both facets of the optical signal processor are shielded by an anti-reflection thin film 16.

The period of the diffraction grating is controlled such that the wavelength of a laser beam generated by the diffraction grating is included in a gain bandwidth of the active layer but is not included in an amplification bandwidth of the gain-clamped optical amplifier area. It is preferable that the oscillation wavelength of the diffraction grating is longer than the wavelength of a signal light. The oscillation wavelength of the diffraction grating can be controlled by varying the period thereof.

In the above-described optical signal processor according to the present invention, the laser beam generated by using the diffraction grating of the gain-clamped optical amplifier area GCOA is inputted into the saturable absorber to reduce recovery time of the saturable absorber, thereby removing excited carriers existing in the saturable absorber by stimulated emission. Accordingly, the saturable absorber operates fast even for a signal having a narrow width, and amplifies light passing therethrough without employing an additional device. Here, the intensity of oscillating light according to the diffraction grating must be lower than transparent input power of the saturable absorber, and power of input signal light must be higher than the transparent input power.

The anti-reflection thin film 16 formed on the both facets restrains the Fabry-Perot resonance mode.

FIGS. 2A and 2B are longitudinal views showing the structure of a semiconductor gain-clamped optical amplifier that can be applied to the optical signal processor of the present invention.

Referring to FIGS. 2A and 2B, the semiconductor gain-clamped optical amplifier is constructed in such a manner that a diffraction grating 4 is formed inside an n-type InP substrate 2, and an undoped InGaAsP active layer 6, a p-type InP clad layer 8, an InGaAs ohmic contact layer 10, and an upper metal electrode 12 are sequentially formed on the substrate 2. Then, a lower metal layer 14 and an anti-reflection thin film 16 are continuously formed on the both facets, respectively. In this structure, as shown in FIG. 2B, the diffraction grating 4 is formed in a predetermined restricted region of the substrate, and the upper metal electrode 12 is formed such that it corresponds to the region where the diffraction grating 4 is not formed.

As described above, the present invention simply integrates the saturable absorber and semiconductor gain-clamped optical amplifier into a single device to shorten the carrier lifetime in the saturable absorber. As a result, response speed of the saturable absorber increases so as to effectively remove fast pulse noise having a narrow width.

Figure 5:
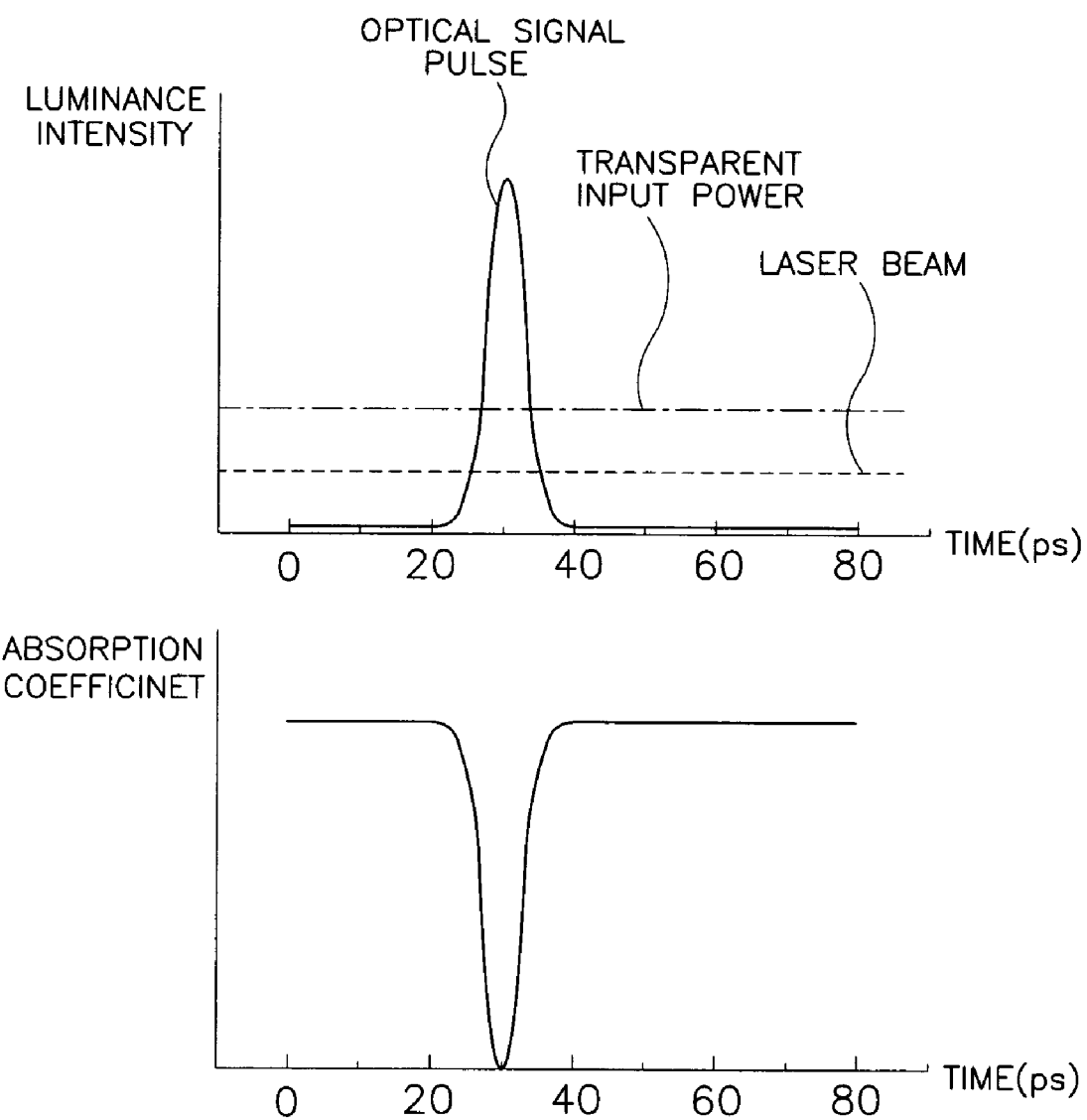
FIG. 5 is a graph showing a variation in absorption coefficient with respect to time when an optical signal pulse and an additional external continuous light are injected into the convention saturable absorber.

A variation in absorption coefficient with respect to time when a pulse with a width of several ps is inputted to the high speed optical signal processor according to the present invention is as shown in FIG. 5. That is, the absorption coefficient is dropped at a high response speed from the rising leading edge where luminance intensity of the optical signal pulse starts to increase and it is recovered symmetrically with a variation in the luminance intensity even at the dropping trailing edge at which the luminance intensity starts to decrease. This variation in the absorption coefficient is obtained because light generated by the diffraction grating 4 in the gain-clamped optical amplifier area GCOA is injected into the saturable absorber to remove excited carriers in the saturable absorber by stimulated emission, therefore reducing recovery time of the saturable absorber.

As described above, the present invention integrates the gain-clamped optical amplifier and saturable absorber into a single device so that an additional device is not needed. Furthermore, a laser beam is inputted into the saturable absorber to remove excited carriers existing inside the saturable absorber so as to shorten recovery time of the saturable absorber. This stably operates the optical signal processor such that luminance intensity of an input optical signal is varied symmetrically with a variation in absorption coefficient of the saturable absorber. Accordingly, optical amplification and noise removal can be simultaneously achieved, and thus the extinction ratio can be increased. This can provide a data transmission system that operates very rapidly even for a fast input pulse or an input pulse having a narrow width.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An optical signal processor, comprising:
   a saturable absorber area including a substrate, an active layer, a clad layer, and a first upper electrode which are sequentially formed on one face of the substrate, and a first lower electrode formed on the other face of the substrate; and
   a gain-clamped optical amplifier area including a substrate having a diffraction grating for generating a laser beam, an active layer, a clad layer, and a second upper electrode which are sequentially formed on one face of the substrate, and a second lower electrode formed on the other face of the substrate, the second upper electrode being isolated from the first upper electrode of the saturable absorber area, wherein
   the laser beam is inputted into the saturable absorber area to reduce a recovery time of the saturable absorber.

2. The optical signal processor as claimed in claim 1, wherein the saturable absorber area further includes an ohmic contact layer formed between the clad layer and the first upper electrode, and the gain-clamped optical amplifier area further includes an ohmic contact layer formed between the clad layer and the second upper electrodes.

3. The optical signal processor as claimed in claim 1, wherein the saturable absorber area and the gain-clamped optical amplifier area are formed on one substrate, and the first and second upper electrodes are isolated from each other according to an etched groove.

4. The optical signal processor as claimed in claim 1, wherein the facets of the saturable absorber area and the gain-clamped optical amplifier area are shielded by an anti-reflection thin film.

5. The optical signal processor as claimed in claim 1, wherein the period of the diffraction grating is varied to control the wavelength of the laser beam generated by the diffraction grating.

6. The optical signal processor as claimed in claim 5, wherein the period of the diffraction grating is controlled such that the wavelength of the laser beam is included in a gain bandwidth of the active layer but is not included in an amplification bandwidth of the gain-clamped optical amplifier area.

7. The optical signal processor as claimed in claim 1, wherein the substrate of the saturable absorber area and the gain-clamped optical amplifier area is formed of n-type InP, the active layer is formed of InGaAsP, and the clad layer is made of InP.

8. The optical signal processor as claimed in claim 1, wherein
   an intensity of the laser beam is lower than a transparent input power of the saturable absorber.

9. The optical signal processor as claimed in claim 1, wherein
   the optical signal processor is to operate rapidly for a fast input pulse having a narrow width.

* * * * *